United States Patent
Song et al.

(10) Patent No.: US 9,478,264 B2
(45) Date of Patent: Oct. 25, 2016

(54) INTEGRATED CIRCUITS AND SEMICONDUCTOR SYSTEMS INCLUDING THE SAME

(71) Applicant: SK hynix Inc., Icheon-si Gyeonggi-do (KR)

(72) Inventors: Keun Soo Song, Icheon-si Gyeonggi-do (KR); Dong Kyun Kim, Cheongju-si Chungcheongbuk-do (KR); Sang Kwon Lee, Yongin-si Gyeonggi-do (KR)

(73) Assignee: SK HYNIX INC., Icheon-Si ( * ) Notice: Subject to any disclaimer, the term of this patent is extended or adjusted under 35 U.S.C. 154(b) by 64 days.

(21) Appl. No.: 14/548,645

(22) Filed: Nov. 20, 2014

(65) Prior Publication Data

US 2015/0364163 A1     Dec. 17, 2015

(30) Foreign Application Priority Data

Jun. 13, 2014  (KR) ........................ 10-2014-0071836

(51) Int. Cl.
*H03K 3/00*     (2006.01)
*G11C 7/10*     (2006.01)
*G11C 7/22*     (2006.01)

(52) U.S. Cl.
CPC ............. *G11C 7/1084* (2013.01); *G11C 7/225* (2013.01); *G11C 7/222* (2013.01)

(58) Field of Classification Search
CPC ....... G11C 7/22; G11C 7/222; H03L 7/0812; H03L 7/0814
See application file for complete search history.

(56) References Cited

U.S. PATENT DOCUMENTS

2011/0316599 A1* 12/2011 Kwak ................... H03L 7/0814
327/158

FOREIGN PATENT DOCUMENTS

KR      1020140026839 A      3/2014

* cited by examiner

*Primary Examiner* — Sibin Chen
(74) *Attorney, Agent, or Firm* — William Park & Associates Ltd.

(57) ABSTRACT

A integrated circuit may include an input buffer suitable for buffering a strobe signal in response to a buffer enablement signal to generate an internal strobe signal, an internal clock generator suitable for receiving the internal strobe signal to generate internal clock signals including different phases. The integrated circuit may include a strobe signal driver suitable for driving the strobe signal in response to a drive control signal. The drive control signal may be enabled prior to the buffer enablement signal being enabled.

16 Claims, 7 Drawing Sheets

INTEGRATED CIRCUITS AND SEMICONDUCTOR SYSTEMS INCLUDING THE SAME

CROSS-REFERENCE TO RELATED APPLICATION

The present application claims priority under 35 U.S.C 119(a) to Korean Application No. 10-2014-0071836, filed on Jun. 13, 2014, in the Korean Intellectual Property Office, which is incorporated herein by reference in its entirety as set forth in full.

BACKGROUND

1. Technical Field

Embodiments of the present disclosure generally relate to integrated circuits generating internal clock signals including a plurality of different phases and semiconductor systems including the integrated circuits.

2. Related Art

In general, semiconductor devices generate a plurality of internal clock signals. The internal clock signals have different phases in order to operate at a high speeds. The internal clock signals are used for receiving or outputting a plurality of data. For example, the semiconductor devices may generate four internal clock signals. The four internal clock signals may have a phase difference of 90 degrees between the four signals. The four internal clock signals may be used for receiving or outputting data. Semiconductor devices implementing internal clock signals having different phases may operate at a higher speeds than other semiconductor devices that receive or output the data using a strobe signal.

SUMMARY

According to an embodiment, an integrated circuit may include an input buffer suitable for buffering a strobe signal in response to a buffer enablement signal to generate an internal strobe signal. The integrated circuit may include an internal clock generator suitable for receiving the internal strobe signal to generate internal clock signals including different phases. The integrated circuit may include a strobe signal driver suitable for driving the strobe signal in response to a drive control signal. The drive control signal may be enabled prior to the buffer enablement signal being enabled.

According to an embodiment, a semiconductor system may include a controller and a semiconductor device. The controller may include a strobe signal driver suitable for driving a strobe signal in response to a drive control signal. The controller may output the strobe signal. The semiconductor device may include an input buffer suitable for buffering the strobe signal in response to a buffer enablement signal to generate an internal strobe signal and an internal clock generator suitable for receiving the internal strobe signal to generate internal clock signals including different phases. The drive control signal may be enabled prior to the buffer enablement signal being enabled.

DETAILED DESCRIPTION

Embodiments of the present disclosure will be described hereinafter with reference to the accompanying drawings. However, the embodiments described herein are for illustrative purposes only and are not intended to limit the scope of the present disclosure.

Various embodiments may be directed to integrated circuits generating internal clock signals and semiconductor systems including the same.

Figure 1:
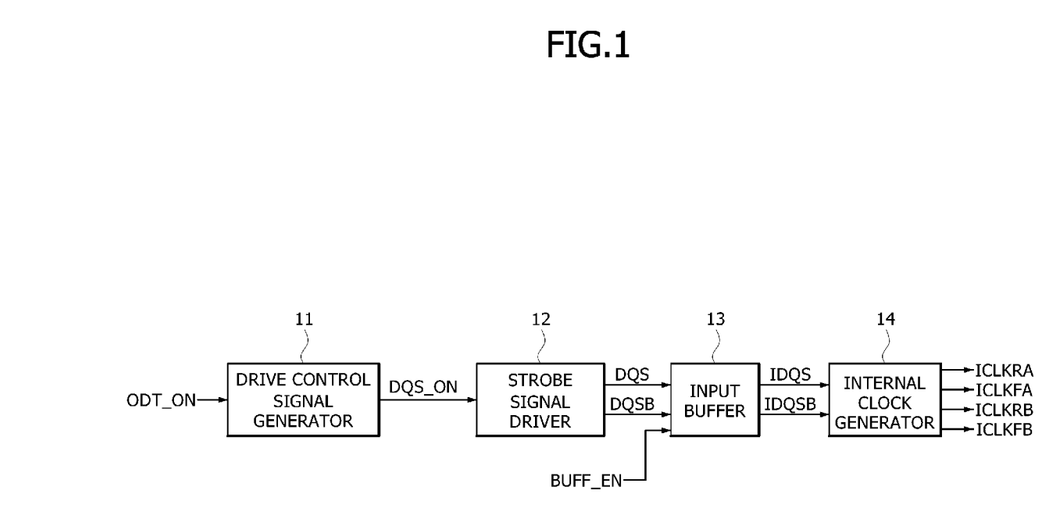
FIG. 1 is a block diagram illustrating a representation of an integrated circuit according to an embodiment.

Referring to FIG. 1, an integrated circuit according to an embodiment may include a drive control signal generator 11, a strobe signal driver 12, an input buffer 13 and an internal clock generator 14.

The drive control signal generator 11 may receive a termination control signal ODT_ON. After receiving the termination control signal ODT_ON the drive control signal generator 11 may use the termination control signal ODT_ON to generate a drive control signal DQS_ON. The drive control signal DQS_ON may be enabled at a point in time earlier than a point in time the termination control signal ODT_ON is enabled. The termination control signal ODT_ON may control the activation of a termination resistor included in the drive control signal generator 11. The termination resistor may be used remove reflected waves that cause the distortion of input signals received by the semiconductor device including the integrated circuit. For example, if the termination control signal ODT_ON is enabled, the termination resistor of an on-die termination (ODT) circuit (not illustrated) may be activated. In an embodiment, the drive control signal generator 11 may be realized such that the drive control signal DQS_ON is generated from the termination control signal ODT_ON. This is because a buffer enablement signal BUFF_EN activating the input buffer 13 may be enabled in synchronization with the termination control signal ODT_ON. In some embodiments, the drive control signal generator 11 may be configured such that the drive control signal DQS_ON is generated from another signal relating to the enablement of the buffer enablement signal BUFF_EN instead of the termination control signal ODT_ON. The drive control signal generator 11 may be designed to be included within a controller (not illustrated) constituting a semiconductor system.

The strobe signal driver 12 may generate a strobe signal DQS and a complementary strobe signal DQSB in response to the drive control signal DQS_ON. The strobe signal driver 12 may drive the strobe signal DQS and the complementary strobe signal DQSB at a point in time when the drive control signal DQS_ON is enabled. That is, the strobe signal driver 12 may drive the strobe signal DQS and the complementary strobe signal DQSB before the input buffer 13 is activated. Thus, the input buffer 13 may be activated after the strobe signal DQS and the complementary strobe signal DQSB are stably driven by the strobe signal driver 12. The strobe signal driver 12 may be configured to be included within a controller (not illustrated) constituting a semiconductor system.

The input buffer 13 may buffer the strobe signal DQS and the complementary strobe signal DQSB in response to the buffer enablement signal BUFF_EN. After buffering the strobe signal DQS and the complementary strobe signal DQSB the input buffer 13 may generate an internal strobe signal IDQS and a complementary internal strobe signal IDQSB. The input buffer 13 may be activated after the strobe signal DQS and the complementary strobe signal DQSB. The strobe signal DQS and the complementary strobe signal DQSB may be stably driven by the strobe signal driver 12, as mentioned above. Thus, the input buffer 13 may receive and buffer the strobe signal DQS and the complementary strobe signal DQSB, which are stably driven by the strobe signal driver 12, to generate the internal strobe signal IDQS and the complementary internal strobe signal IDQSB having stable waveforms. In an embodiment, the buffer enablement signal BUFF_EN may be enabled in synchronization with the termination control signal ODT_ON. The buffer enablement signal BUFF_EN may be enabled in synchronization with a point in time when the termination control signal ODT_ON is enabled. In some embodiments, the buffer enablement signal BUFF_EN may be enabled in synchronization with a signal other than the termination control signal ODT_ON.

The internal clock generator 14 may receive the internal strobe signal IDQS and the complementary internal strobe signal IDQSB. After receiving the internal strobe signal IDQS and the complementary internal strobe signal IDQSB the internal clock generator may use the internal strobe signal IDQS and the complementary internal strobe signal IDQSB to generate a first internal clock signal ICLKRA, a second internal clock signal ICLKRB, a third internal clock signal ICLKFA and a fourth internal clock signal ICLKFB. The first, second, third and fourth internal clock signals ICLKRA, ICLKRB, ICLKFA and ICLKFB may have phases different from each other. The phases of the first, second, third and fourth internal clock signals ICLKRA, ICLKRB, ICLKFA and ICLKFB may be set differently according to the various embodiments. A configuration of the internal clock generator 14 will be described in further with reference to FIGS. 2, 3 and 4.

Figure 2:
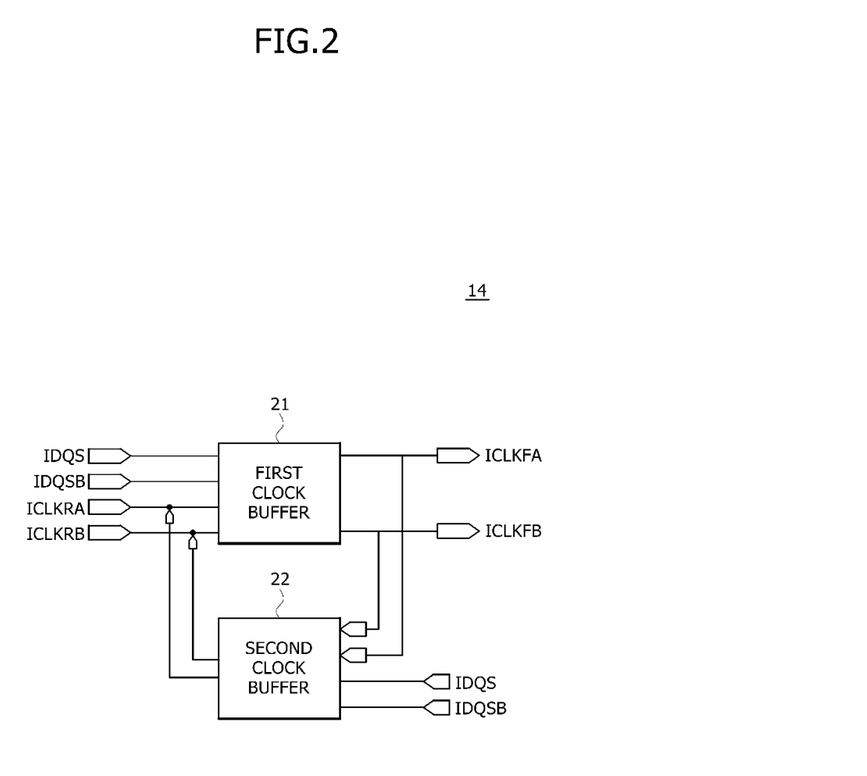
FIG. 2 is a block diagram illustrating a representation of an internal clock generator included in the integrated circuit of FIG. 1.

Referring to FIG. 2, the internal clock generator 14 may include a first clock buffer 21 and a second clock buffer 22. The first clock buffer 21 may buffer the first and second internal clock signals ICLKRA and ICLKRB in response to the internal strobe signal IDQS and the complementary internal strobe signal IDQSB. After buffering the first and second internal clock signals ICLKRA and ICLKRB, the first clock buffer 21 may generate the third and fourth internal clock signals ICLKFA and ICLKFB. The second clock buffer 22 may buffer the third and fourth internal clock signals ICLKFA and ICLKFB in response to the internal strobe signal IDQS and the complementary internal strobe signal IDQSB. After buffering the third and fourth internal clock signals ICLKFA and ICLKFB, the second clock buffer 22 may generate the first and second internal clock signals ICLKRA and ICLKRB.

The first clock buffer 21 may inversely buffer the first internal clock signal ICLKRA in synchronization with a falling edge of the internal strobe signal IDQS (corresponding to a rising edge of the complementary internal strobe signal IDQSB) to generate the fourth internal clock signal ICLKFB. The first clock buffer 21 may inversely buffer the second internal clock signal ICLKRB in synchronization with a falling edge of the internal strobe signal IDQS (corresponding to a rising edge of the complementary internal strobe signal IDQSB) to generate the third internal clock signal ICLKFA.

The second clock buffer 22 may inversely buffer the third internal clock signal ICLKFA in synchronization with a rising edge of the internal strobe signal IDQS (corresponding to a falling edge of the complementary internal strobe signal IDQSB) to generate the first internal clock signal ICLKRA. The second clock buffer 22 may inversely buffer the fourth internal clock signal ICLKFB in synchronization with a rising edge of the internal strobe signal IDQS (corresponding to a falling edge of the complementary internal strobe signal IDQSB) to generate the second internal clock signal ICLKRB.

In an embodiment, the first, second, third and fourth internal clock signals ICLKRA, ICLKRB, ICLKFA and ICLKFB may be generated to have a phase difference therebetween. For example, the first, second, third and fourth internal clock signals ICLKRA, ICLKRB, ICLKFA and ICLKFB may be generated to have a phase difference of, for example but not limited to, 90 degrees therebetween. For example, the first internal clock signal ICLKRA may precede the fourth internal clock signal ICLKFB by a phase of 270 degrees. For example, the third internal clock signal ICLKFA may precede the fourth internal clock signal ICLKFB by a phase of 180 degrees. For example, the second internal clock signal ICLKRB may precede the fourth internal clock signal ICLKFB by a phase of 90 degrees.

Figure 3:
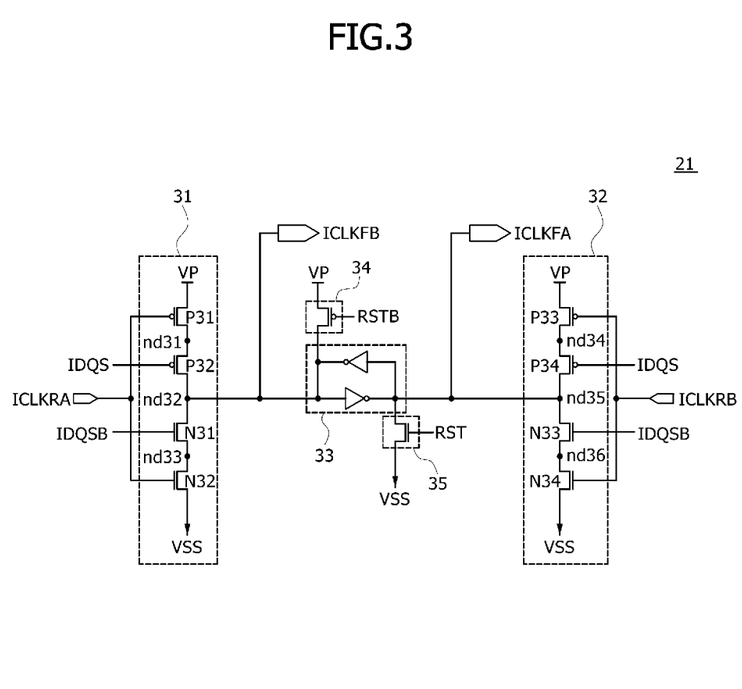
FIG. 3 is a circuit diagram illustrating a representation of a first clock buffer included in the internal clock generator of FIG. 2.

Referring to FIG. 3, the first clock buffer 21 may include a first buffer 31, a second buffer 32, and a first latch unit 33. The first clock buffer 21 may include a first initialization element 34 and a second initialization element 35.

The first buffer 31 may be configured to include a PMOS transistor P31 and a PMOS transistor P32. The first buffer 31 may be configured to include an NMOS transistor N31 and an NMOS transistor N32. The PMOS transistor P31 may be coupled between a drive voltage VP terminal and a node ND31. The PMOS transistor P31 may be turned on in response to the first internal clock signal ICLKRA. The PMOS transistor P32 may be coupled between the node ND31 and a node ND32. The PMOS transistor P32 may be turned on in response to the internal strobe signal IDQS. The NMOS transistor N31 may be coupled between the node ND32 and a node ND33. The NMOS transistor N31 may be turned on in response to the complementary internal strobe signal IDQSB. The NMOS transistor N32 may be coupled between the node ND33 and a ground voltage VSS terminal. The NMOS transistor N32 may be turned on in response to the first internal clock signal ICLKRA. The first buffer 31 including the aforementioned configuration may inversely buffer the first internal clock signal ICLKRA in synchronization with, for example, a falling edge of the internal strobe signal IDQS (corresponding to a rising edge of the complementary internal strobe signal IDQSB) to generate the fourth internal clock signal ICLKFB. The drive voltage VP may be an internal voltage generated in a semiconductor device or an external voltage supplied from an external device.

The second buffer 32 may be configured to include a PMOS transistor P33 and a PMOS transistor P34. The second buffer 32 may be configured to include an NMOS transistor N33 and an NMOS transistor N34. The PMOS transistor P33 may be coupled between the drive voltage VP terminal and a node ND34. The PMOS transistor P33 may be turned on in response to the second internal clock signal ICLKRB. The PMOS transistor P34 may be coupled between the node ND34 and a node ND35. The PMOS transistor P34 may be turned on in response to the internal strobe signal IDQS. The NMOS transistor N33 may be coupled between the node ND35 and a node ND36. The NMOS transistor N33 may be turned on in response to the complementary internal strobe signal IDQSB. The NMOS transistor N34 may be coupled between the node ND36 and the ground voltage VSS terminal. The NMOS transistor N34 may be turned on in response to the second internal clock signal ICLKRB. The second buffer 32 including the aforementioned configuration may inversely buffer the second internal clock signal ICLKRB in synchronization with, for example, a falling edge of the internal strobe signal IDQS (corresponding to a rising edge of the complementary internal strobe signal IDQSB) to generate the third internal clock signal ICLKFA.

The first latch unit 33 may be coupled between the node ND32 and the node ND35. The first latch unit 33 may latch voltage levels of the nodes ND32 and ND35. The first initialization element 34 may drive the node ND32 to the drive voltage VP in response to a complementary reset signal RSTB. The second initialization element 35 may drive the node ND35 to the ground voltage VSS in response to a reset signal RST. The reset signal RST may be set to have a logic "high" level when the semiconductor device is initialized, and the complementary reset signal RSTB may be set to have a logic "low" level when the semiconductor device is initialized.

Figure 4:
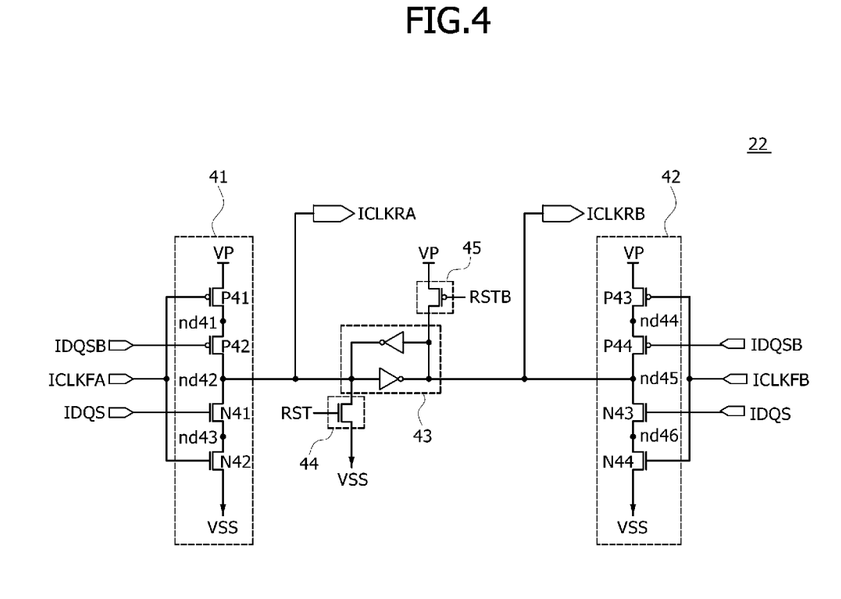
FIG. 4 is a circuit diagram illustrating a representation of a second clock buffer included in the internal clock generator of FIG. 2.

Referring to FIG. 4, the second clock buffer 22 may include a third buffer 41, a fourth buffer 42, a second latch unit 43. The second clock buffer 22 may include a third initialization element 44 and a fourth initialization element 45.

The third buffer 41 may be configured to include a PMOS transistor P41 and a PMOS transistor P42. The third buffer 41 may be configured to include an NMOS transistor N41 and an NMOS transistor N42. The PMOS transistor P41 may be coupled between the drive voltage VP terminal and a node ND41. and the PMOS transistor P41 may be turned on in response to the third internal clock signal ICLKFA. The PMOS transistor P42 may be coupled between the node ND41 and a node ND42. The PMOS transistor P42 may be turned on in response to the complementary internal strobe signal IDQSB. The NMOS transistor N41 may be coupled between the node ND42 and a node ND43. The NMOS transistor N41 may be turned on in response to the internal strobe signal IDQS. The NMOS transistor N42 may be coupled between the node ND43 and the ground voltage VSS terminal. The NMOS transistor N42 may be turned on in response to the third internal clock signal ICLKFA. The third buffer 31 including the aforementioned configuration may inversely buffer the third internal clock signal ICLKFA in synchronization with, for example, a rising edge of the internal strobe signal IDQS (corresponding to a falling edge of the complementary internal strobe signal IDQSB) to generate the first internal clock signal ICLKRA.

The fourth buffer 42 may be configured to include a PMOS transistor P43 and a PMOS transistor P44. The fourth buffer 42 may be configured to include an NMOS transistor N43 and an NMOS transistor N44. The PMOS transistor P43 may be coupled between the drive voltage VP terminal and a node ND44. The PMOS transistor P43 may be turned on in response to the fourth internal clock signal ICLKFB. The PMOS transistor P44 may be coupled between the node ND44 and a node ND45. The PMOS transistor P44 may be turned on in response to the complementary internal strobe signal IDQSB. The NMOS transistor N43 may be coupled between the node ND45 and a node ND46. The NMOS transistor N43 may be turned on in response to the internal strobe signal IDQS. The NMOS transistor N44 may be coupled between the node ND46 and the ground voltage VSS terminal. The NMOS transistor N44 may be turned on in response to the fourth internal clock signal ICLKFB. The fourth buffer 42 including the aforementioned configuration may inversely buffer the fourth internal clock signal ICLKFB in synchronization with, for example, a rising edge of the internal strobe signal IDQS (corresponding to a falling edge of the complementary internal strobe signal IDQSB) to generate the second internal clock signal ICLKRB.

The second latch unit 43 may include inverter 145 and inverter 144 coupled in series. The output of inverter 145 may be coupled to the input of inverter 144. The output of inverter 144 may be coupled to the input of inverter 145. The fourth initialization element 45 may be coupled between the output of inverter 144 and the drive voltage VP terminal. The fourth initialization element 45 may include for example a PMOS transistor. The third initialization element 44 may be coupled between the input of inverter 144 and the ground voltage VSS terminal. The third initialization element 44 may include an NMOS transistor.

Figure 5:
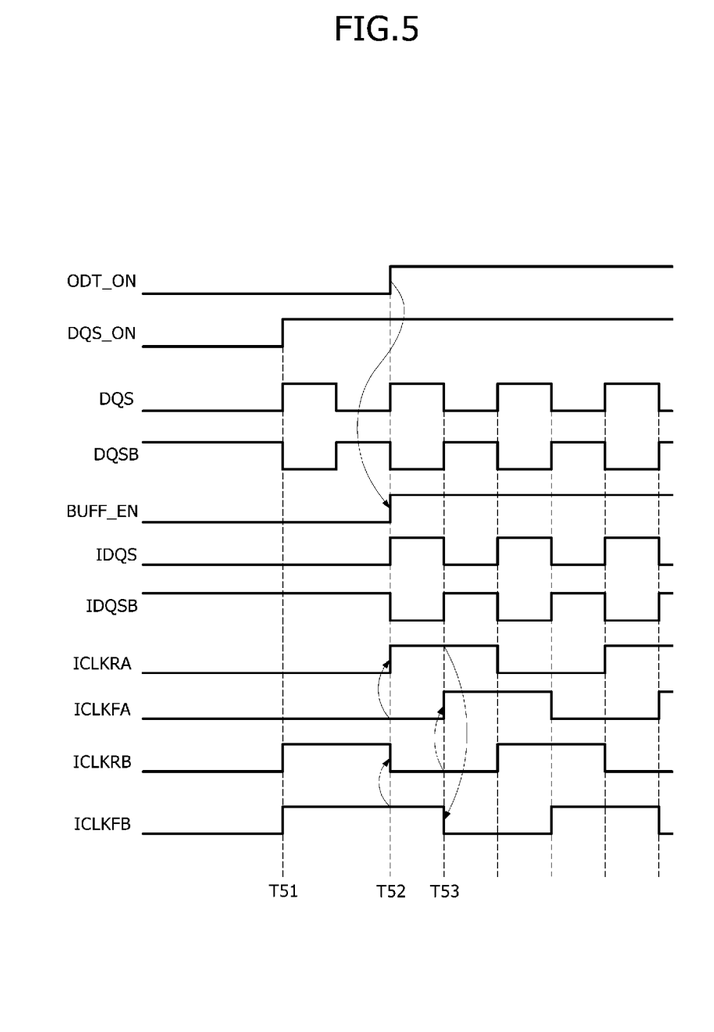
FIG. 5 is a timing diagram illustrating a representation of an operation of the integrated circuit illustrate in FIGS. 1 to 4.

An operation of the integrated circuit illustrated in FIGS. 1 to 4 will be described hereinafter with reference to FIG. 5.

First, at a point of time "T51", the drive control signal DQS_ON may be enabled to have a logic "high" level. In an embodiment, the drive control signal DQS_ON may be enabled at the point of time "T51" that is earlier than a point of time "T52" that the termination control signal ODT_ON and the buffer enablement signal BUFF_EN are enabled. Thus, because the strobe signal DQS and the complementary strobe signal DQSB are driven from the point of time "T51", the strobe signal DQS and the complementary strobe signal DQSB may be stably generated to have perfect waveforms at the point of time "T52" that the input buffer 13 is activated. At the point of time "T52", the buffer enablement signal BUFF_EN may be enabled to have a logic "high" level in synchronization with the termination control signal ODT_ON.

Next, if the reset signal RST having a logic "high" level and the complementary reset signal RSTB having a logic "low" level are inputted to the first and second internal clock generators 21 and 22 during a period between the point of time "T51" and the point of time "T52" for an initialization operation, the first and third internal clock signals ICLKRA and ICLKFA may be initialized to have logic "low" levels and the second and fourth internal clock signals ICLKRB and ICLKFB may be initialized to have logic "high" levels.

Next, at the point of time "T52", the third internal clock signal ICLKFA may be inversely buffered in synchronization with a rising edge of the internal strobe signal IDQS (corresponding to a falling edge of the complementary internal strobe signal IDQSB) to generate the first internal clock signal ICLKRA, and the fourth internal clock signal ICLKFB may be inversely buffered in synchronization with a rising edge of the internal strobe signal IDQS (corresponding to a falling edge of the complementary internal strobe signal IDQSB) to generate the second internal clock signal ICLKRB. Thus, at the point of time "T52", a logic level of the first internal clock signal ICLKRA may be changed from a logic "low" level into a logic "high" level, and a logic level of the second internal clock signal ICLKRB may be changed from a logic "high" level into a logic "low" level.

Next, at a point of time "T53", the first internal clock signal ICLKRA may be inversely buffered in synchronization with a falling edge of the internal strobe signal IDQS (corresponding to a rising edge of the complementary internal strobe signal IDQSB) to generate the fourth internal clock signal ICLKFB, and the second internal clock signal ICLKRB may be inversely buffered in synchronization with a falling edge of the internal strobe signal IDQS (corresponding to a rising edge of the complementary internal strobe signal IDQSB) to generate the third internal clock signal ICLKFA. Thus, at the point of time "T53", a logic level of the fourth internal clock signal ICLKFB may be changed from a logic "high" level into a logic "low" level, and a logic level of the third internal clock signal ICLKFA may be changed from a logic "low" level into a logic "high" level.

As described above, level transitions of the first and second internal clock signals ICLKRA and ICLKRB may simultaneously occur at a rising edge of the internal strobe signal IDQS (corresponding to a falling edge of the complementary internal strobe signal IDQSB), and level transitions of the third and fourth internal clock signals ICLKFA and ICLKFB may simultaneously occur at a falling edge of the internal strobe signal IDQS (corresponding to a rising edge of the complementary internal strobe signal IDQSB). As a result of the above operation, the first, second, third and fourth internal clock signals ICLKRA, ICLKRB, ICLKFA and ICLKFB may be generated by the internal clock generator 14 to have a phase difference of 90 degrees therebetween. Specifically, the first internal clock signal ICLKRA may precede the fourth internal clock signal ICLKFB by a phase of 270 degrees, the third internal clock signal ICLKFA may precede the fourth internal clock signal ICLKFB by a phase of 180 degrees, and the second internal clock signal ICLKRB may precede the fourth internal clock signal ICLKFB by a phase of 90 degrees.

In summary, the integrated circuit according to the embodiments may drive the strobe signal DQS and the complementary strobe signal DQSB prior to an activation of the input buffer 13 such that the strobe signal DQS and the complementary strobe signal DQSB are stably driven at a point of time that the input buffer 13 is activated. Thus, the input buffer 13 may receive and buffer the strobe signal DQS and the complementary strobe signal DQSB, which are stably driven by the strobe signal driver 12, to generate the internal strobe signal IDQS and the complementary internal strobe signal IDQSB having stable waveforms.

Figure 6:
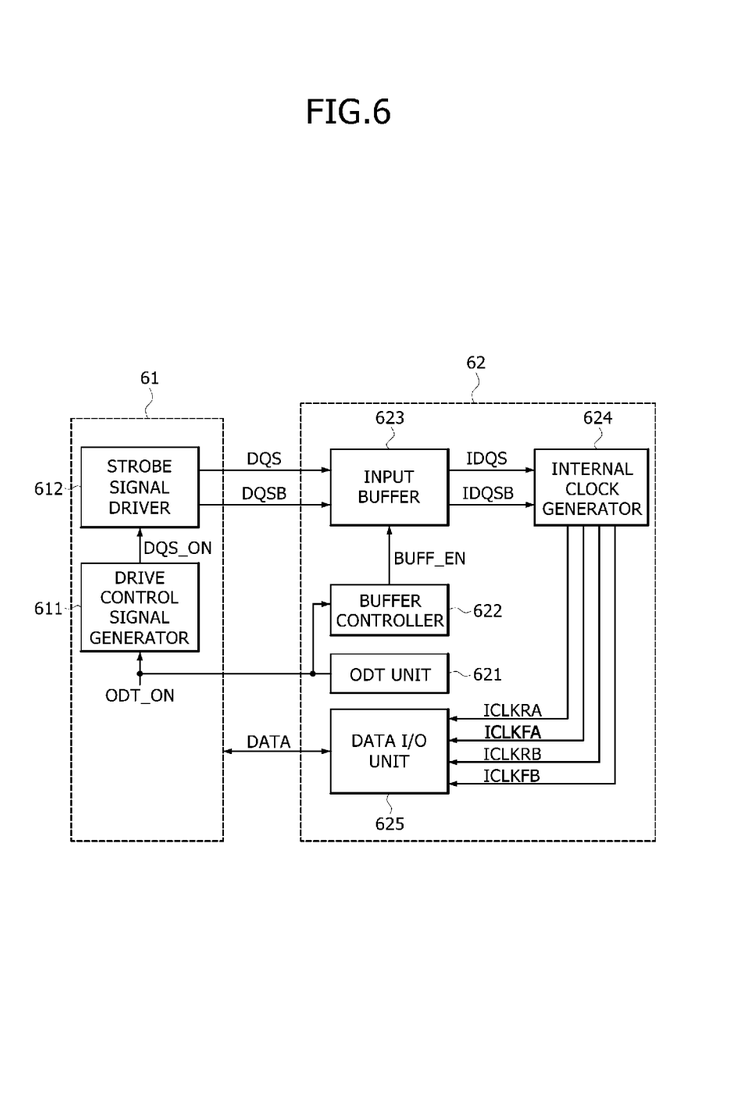
FIG. 6 is a block diagram illustrating a representation of a semiconductor system according to an embodiment.

Referring to FIG. 6, a semiconductor system according to an embodiment may include a controller 61 and a semiconductor device 62. The controller 61 may be configured to include a drive control signal generator 611 and a strobe signal driver 612. The semiconductor device 62 may be configured to include an on-die termination (ODT) unit 621, a buffer controller 622, and an input buffer 623. The semiconductor device 62 may be configured to include an internal clock generator 624 and a data input/output (I/O) unit 625.

The drive control signal generator 611 may receive a termination control signal ODT_ON. After receiving the termination control signal ODT_ON the drive control signal generator 611 may generate a drive control signal DQS_ON. The drive control signal DQS_ON may be enabled at a point in time earlier than a point in time when the termination control signal ODT_ON is enabled. In an embodiment, the drive control signal generator 611 may be configured such that the drive control signal DQS_ON is generated from the termination control signal ODT_ON. This is because a buffer enablement signal BUFF_EN activating the input buffer 623 is enabled in synchronization with the termination control signal ODT_ON. In some embodiments, the drive control signal generator 611 may be configured such that the drive control signal DQS_ON is generated from another signal relating to enablement of the buffer enablement signal BUFF_EN instead of the termination control signal ODT_ON.

The strobe signal driver 612 may generate a strobe signal DQS and a complementary strobe signal DQSB in response to the drive control signal DQS_ON. The strobe signal driver 612 may drive the strobe signal DQS and the complementary strobe signal DQSB at a point of time when the drive control signal DQS_ON is enabled. That is, the strobe signal driver 612 may drive the strobe signal DQS and the complementary strobe signal DQSB before the input buffer 623 is activated. Thus, the input buffer 623 may be activated after the strobe signal DQS and the complementary strobe signal DQSB are stably driven by the strobe signal driver 612.

The ODT unit 621 may be activated in synchronization with the termination control signal ODT_ON. The ODT unit 621 may include a plurality of termination resistors to remove reflected waves that cause distortion of input signals inputted to the semiconductor device 62. The plurality of termination resistors included in the ODT unit 621 may be activated if the termination control signal ODT_ON is enabled.

The buffer controller 622 may generate the buffer enablement signal BUFF_EN in synchronization with the termination control signal ODT_ON. In an embodiment, the buffer controller 622 may be configured to generate the buffer enablement signal BUFF_EN. The buffer enablement signal BUFF_EN may be enabled in synchronization with a point of time when the termination control signal ODT_ON is enabled.

The input buffer 623 may buffer the strobe signal DQS and the complementary strobe signal DQSB in response to the buffer enablement signal BUFF_EN to generate an internal strobe signal IDQS and a complementary internal strobe signal IDQSB. The input buffer 623 may be activated after the strobe signal DQS and the complementary strobe signal DQSB are stably driven by the strobe signal driver 612. Thus, the input buffer 623 may receive and buffer the strobe signal DQS and the complementary strobe signal DQSB, which are stably driven by the strobe signal driver 612, to generate the internal strobe signal IDQS and the complementary internal strobe signal IDQSB having stable waveforms. In an embodiment, the buffer enablement signal BUFF_EN may be enabled in synchronization with the termination control signal ODT_ON. That is, the buffer enablement signal BUFF_EN may be enabled in synchronization with a point of time when the termination control signal ODT_ON is enabled. In some embodiments, the buffer enablement signal BUFF_EN may be enabled in synchronization with a signal other than the termination control signal ODT_ON.

The internal clock generator 624 may receive the internal strobe signal IDQS and the complementary internal strobe signal IDQSB to generate a first internal clock signal ICLKRA, a second internal clock signal ICLKRB, a third internal clock signal ICLKFA and a fourth internal clock signal ICLKFB. The first, second, third and fourth internal clock signals ICLKRA, ICLKRB, ICLKFA and ICLKFB may have phases which are different from each other. The phases of the first, second, third and fourth internal clock signals ICLKRA, ICLKRB, ICLKFA and ICLKFB may be set to be different according to the various embodiments. The internal clock generator 624 may be realized to have substantially the same configuration as the internal clock generator 14 described with reference to FIGS. 1, 2, 3 and 4.

The data I/O unit 625 may receive or output a plurality of data DATA in synchronization with the first, second, third and fourth internal clock signals ICLKRA, ICLKRB, ICLKFA and ICLKFB. The data I/O unit 625 may output the data DATA to the controller 61 or may receive the data DATA from the controller 61, in synchronization with the first, second, third and fourth internal clock signals ICLKRA, ICLKRB, ICLKFA and ICLKFB.

As described above, the semiconductor system according to an embodiment may drive the strobe signal DQS and the complementary strobe signal DQSB prior to an activation of the input buffer 623, thereby stably driving the strobe signal DQS and the complementary strobe signal DQSB at a point of time when the input buffer 623 is activated. Thus, the input buffer 623 may receive and buffer the strobe signal DQS and the complementary strobe signal DQSB, which may be stably driven by the strobe signal driver 612, to generate the internal strobe signal IDQS and the complementary internal strobe signal IDQSB including stable waveforms.

The integrated circuits and/or the semiconductor systems discussed above (see FIGS. 1-6) are particular useful in the design of memory devices, processors, and computer systems. For example, referring to FIG. 7, a block diagram of a system employing the integrated circuits and/or the semiconductor systems in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

Figure 7:
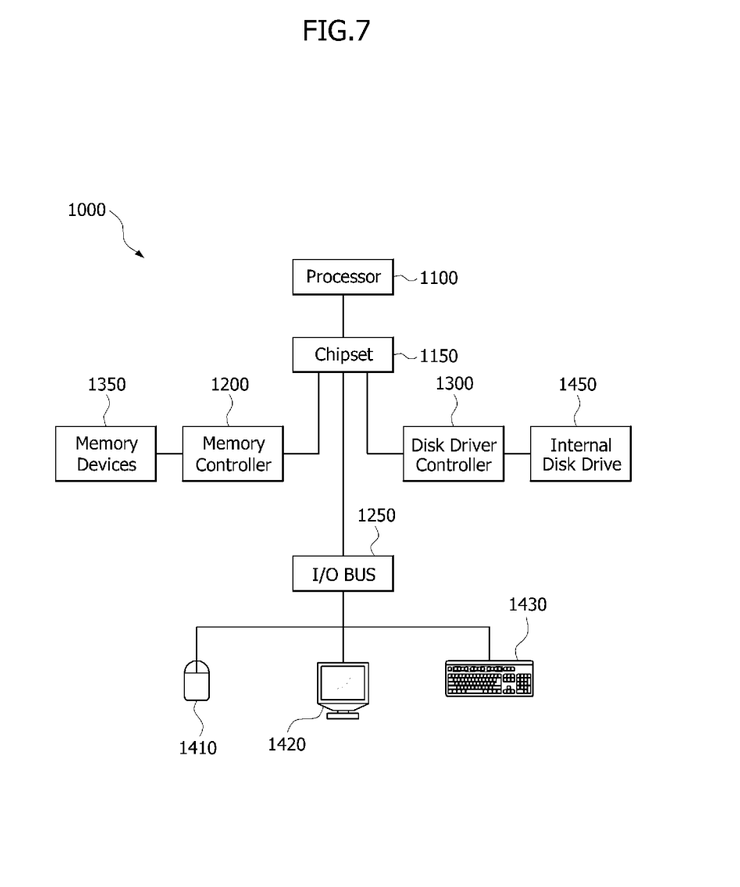
FIG. 7 illustrates a block diagram of an example of a representation of a system employing the integrated circuit and/or the semiconductor system in accordance with the embodiments discussed above with relation to FIGS. 1-6.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one integrated circuit and/or the semiconductor system as discussed above with reference to FIGS. 1-6. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one integrated circuit and/or the semiconductor system as discussed above with relation to FIGS. 1-6, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 7 is merely one example of a system employing the integrated circuit and/or the semiconductor system as discussed above with relation to FIGS. 1-6. In alternate embodiments, such as cellular phones or digital cameras, the components may differ from the embodiments illustrated in FIG. 7.

What is claimed is:

1. An integrated circuit comprising:
    an input buffer suitable for buffering a strobe signal in response to a buffer enablement signal to generate an internal strobe signal;
    an internal clock generator suitable for receiving the internal strobe signal to generate internal clock signals including different phases; and
    a strobe signal driver suitable for driving the strobe signal in response to a drive control signal,
    wherein the drive control signal is enabled prior to the buffer enablement signal being enabled, wherein the buffer enablement signal is enabled in synchronization with a termination control signal, wherein the termination control signal controls an activation of a termination resistor,
    wherein the internal clock signals include a first internal clock signal, a second internal clock signal, a third internal clock signal and a fourth internal clock signal; and
    wherein the internal clock generator includes:
    a first clock buffer suitable for inversely buffering the first and second internal clock signals in response to the internal strobe signal to generate the third and fourth internal clock signals; and
    a second clock buffer suitable for inversely buffering the third and fourth internal clock signals in response to the internal strobe signal to generate the first and second internal clock signals.

2. The integrated circuit of claim 1, further comprising a drive control signal generator suitable for generating the drive control signal, wherein the drive control signal is enabled prior to an enablement of the termination control signal.

3. The integrated circuit of claim 1,
wherein the first internal clock signal precedes the fourth internal clock signal by a phase of 270 degrees;
wherein the third internal clock signal precedes the fourth internal clock signal by a phase of 180 degrees; and
wherein the second internal clock signal precedes the fourth internal clock signal by a phase of 90 degrees.

4. The integrated circuit of claim 1, wherein the first clock buffer is suitable for inversely buffering the first internal clock signal in synchronization with a first edge of the internal strobe signal to generate the fourth internal clock signal.

5. The integrated circuit of claim 4, wherein the first clock buffer is suitable for inversely buffering the second internal clock signal in synchronization with the first edge of the internal strobe signal to generate the third internal clock signal.

6. The integrated circuit of claim 5, wherein the second clock buffer is suitable for inversely buffering the third internal clock signal in synchronization with a second edge of the internal strobe signal to generate the first internal clock signal.

7. The integrated circuit of claim 6, wherein the second clock buffer is suitable for inversely buffering the fourth internal clock signal in synchronization with the second edge of the internal strobe signal to generate the second internal clock signal.

8. The integrated circuit of claim 7, wherein the first edge of the internal strobe signal is a falling edge of the internal strobe signal, and the second edge of the internal strobe signal is a rising edge of the internal strobe signal.

9. The integrated circuit of claim 1, wherein the first clock buffer includes:
a first buffer suitable for inversely buffering the first internal clock signal in synchronization with a first edge of the internal strobe signal to output the fourth internal clock signal through a first node; and
a second buffer suitable for inversely buffering the second internal clock signal in synchronization with the first edge of the internal strobe signal to output the third internal clock signal through a second node.

10. The integrated circuit of claim 9, wherein the first clock buffer further includes:
a latch unit coupled between the first and second nodes to latch voltage levels of the first and second nodes;
a first initialization element suitable for initializing the voltage level of the first node during an initialization operation; and
a second initialization element suitable for initializing the voltage level of the second node during the initialization operation.

11. The integrated circuit of claim 9, wherein the second clock buffer includes:
a third buffer suitable for inversely buffering the third internal clock signal in synchronization with a second edge of the internal strobe signal to output the first internal clock signal through a third node; and
a fourth buffer suitable for inversely buffering the fourth internal clock signal in synchronization with the second edge of the internal strobe signal to output the second internal clock signal through a fourth node.

12. A semiconductor system comprising:
a controller including a strobe signal driver suitable for driving a strobe signal in response to a drive control signal, wherein the controller outputs the strobe signal; and
a semiconductor device including an input buffer suitable for buffering the strobe signal in response to a buffer enablement signal to generate an internal strobe signal and an internal clock generator suitable for receiving the internal strobe signal to generate internal clock signals including different phases,
wherein the drive control signal is enabled prior to the buffer enablement signal being enabled, wherein the buffer enablement signal is enabled in synchronization with a termination control signal, wherein the termination control signal controls an activation of a termination resistor,
wherein the internal clock signals include a first internal clock signal, a second internal clock signal, a third internal clock signal and a fourth internal clock signal; and
wherein the internal clock generator includes:
a first clock buffer suitable for inversely buffering the first and second internal clock signals in response to the internal strobe signal to generate the third and fourth internal clock signals; and
a second clock buffer suitable for inversely buffering the third and fourth internal clock signals in response to the internal strobe signal to generate the first and second internal clock signals.

13. The semiconductor system of claim 12, wherein the controller further includes a drive control signal generator suitable for generating the drive control signal,
wherein the drive control signal is enabled prior to an enablement of the termination control signal.

14. The semiconductor system of claim 12,
wherein the first internal clock signal precedes the fourth internal clock signal by a phase of 270 degrees;
wherein the third internal clock signal precedes the fourth internal clock signal by a phase of 180 degrees; and
wherein the second internal clock signal precedes the fourth internal clock signal by a phase of 90 degrees.

15. The semiconductor system of claim 12,
wherein the first clock buffer is suitable for inversely buffering the first internal clock signal in synchronization with a first edge of the internal strobe signal to generate the fourth internal clock signal; and
wherein the first clock buffer is suitable for inversely buffering the second internal clock signal in synchronization with the first edge of the internal strobe signal to generate the third internal clock signal.

16. The semiconductor system of claim 15,
wherein the second clock buffer is suitable for inversely buffering the third internal clock signal in synchronization with a second edge of the internal strobe signal to generate the first internal clock signal; and
wherein the second clock buffer is suitable for inversely buffering the fourth internal clock signal in synchronization with the second edge of the internal strobe signal to generate the second internal clock signal.

* * * * *